(12) United States Patent
Eggers et al.

(10) Patent No.: US 10,175,330 B2
(45) Date of Patent: Jan. 8, 2019

(54) DIXON MR IMAGING WITH SUPPRESSION OF FLOW ARTIFACTS

(71) Applicant: KONINKLIJKE PHILIPS N.V., Eindhoven (NL)

(72) Inventors: Holger Eggers, Eindhoven (NL); Peter Bornert, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 110 days.

(21) Appl. No.: 15/513,168

(22) PCT Filed: Sep. 17, 2015

(86) PCT No.: PCT/EP2015/071354
§ 371 (c)(1),
(2) Date: Mar. 22, 2017

(87) PCT Pub. No.: WO2016/046062
PCT Pub. Date: Mar. 31, 2016

(65) Prior Publication Data
US 2017/0307715 A1    Oct. 26, 2017

(30) Foreign Application Priority Data

Sep. 26, 2014   (EP) .................................... 14186543

(51) Int. Cl.
| G01V 3/00 | (2006.01) |
| G01R 33/565 | (2006.01) |
| G01R 33/48 | (2006.01) |
| G01R 33/563 | (2006.01) |
| G01R 33/567 | (2006.01) |

(52) U.S. Cl.
CPC ... G01R 33/56509 (2013.01); G01R 33/4828 (2013.01); G01R 33/563 (2013.01);
(Continued)

(58) Field of Classification Search
USPC .......................................................... 324/309
See application file for complete search history.

(56) References Cited

U.S. PATENT DOCUMENTS

| 7,667,459 B2 * | 2/2010 | Jensen .................. G01R 33/50 324/307 |
| 2010/0156416 A1 * | 6/2010 | Martinez-Moller ... A61B 5/055 324/309 |

(Continued)

OTHER PUBLICATIONS

Kaining Shi et al: "Flow compensation for the fast spin echo triple-echo Dixon sequence", Magnetic Resonance Imaging, Elsevier Science, Tarrytown, NY, US, vol. 29, No. 2, Sep. 21, 2010 (Sep. 21, 2010), pp. 293-299.

(Continued)

*Primary Examiner* — Rodney Fuller

(57) ABSTRACT

The invention relates to a method of MR imaging of a body (10) of a patient. It is an object of the invention to provide a method that enables efficient compensation of flow artifacts, especially for MR angiography in combination with Dixon water/fat separation. The method of the invention comprises the steps of: a) generating MR echo signals at two or more echo times by subjecting the portion of the body (10) to a MR imaging sequence of RF pulses and switched magnetic field gradients, wherein the MR imaging sequence is a Dixon sequence; b) acquiring the MR echo signals; c) reconstructing one or more single-echo MR images from the MR echo signals; d) segmenting the blood vessels from the MR images; e) detecting and compensating for blood flow-induced variations of the amplitude or phase in the single-echo MR images within the blood vessel lumen, and f) separating signal contributions from water and fat spins to the compensated single-echo MR images. Moreover, the invention relates to a MR device (1) and to a computer program for a MR device (1).

12 Claims, 3 Drawing Sheets

(52) U.S. Cl.
CPC ... *G01R 33/5673* (2013.01); *G01R 33/56308* (2013.01); *G01R 33/56316* (2013.01); *G01R 33/56527* (2013.01)

(56) References Cited

U.S. PATENT DOCUMENTS

2014/0368195 A1* 12/2014 Eggers .............. G01R 33/4828
324/309
2017/0143853 A1* 5/2017 Maki ..................... A61B 5/418

OTHER PUBLICATIONS

Pauline W. Worters et al: "Inversion-recovery-prepared dixon bSSFP:Initial clinical experience with a novel pulse sequence for renal MRA within a breathhold",Journal of Magnetic Resonance Imaging, vol. 35, No. 4, Nov. 16, 2011 (Nov. 16, 2011), pp. 875-881.
0 Josephs et al: "Reducing Ghosting in EPI Using Trajectory Based Reconstruction with Dixon Method Fat Suppressed Navigator Echoes at 7T",Proceedings of the International Society for Magnetic Resonance in Medicine, 18th Scientific Meeting and Exhibition, Stockholm, Sweden, May 1-7, 2010, vol. 18, Apr. 17, 2010 (Apr. 17, 2010), p. 5058.
Yi Wang et al: "A Three-Point Dixon Method for Water and Fat Separation Using 2D and 3DGradient-Echo Techniques",Journal of Magnetic Resonance Imaging,vol. 8, No. 3, May 1, 1998 (May 1, 1998), pp. 703-710.
Korosec F R et al: "MR Angiography Using Velocity-Selective Preparation Pulses and Segmented Gradient-Echo Acquisition",Magnetic Resonance in Medicine, John Wiley &SONS, Inc, US vol. 30 No. 61 Dec. 1993 (Dec. 1, 1993), pp. 704-714.

* cited by examiner

DIXON MR IMAGING WITH SUPPRESSION OF FLOW ARTIFACTS

CROSS REFERENCE TO RELATED APPLICATIONS

This application is a U.S. national phase application of International Application No. PCT/EP2015/071354, filed on Sep. 17, 2015, which claims the benefit of EP Application Serial No. 14186543.6 filed on Sep. 26, 2014 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

It is important to note that transverse magnetization dephases also in presence of constant magnetic field gradients. This process can be reversed, similar to the formation of RF induced echoes, by appropriate gradient reversal forming a so-called gradient echo. However, in case of a gradient echo, effects of main field inhomogeneities, chemical shift and other off-resonances effects are not refocused, in contrast to the RF refocused echo.

In MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding gradient echoes, acquired at different echo times, is combined. This may be considered as chemical shift encoding, in which an additional dimension, the chemical shift dimension, is defined and encoded by acquiring a couple of images at slightly different echo times. In particular for water/fat separation, these types of experiments are often referred to as Dixon-type of measurements. By means of Dixon imaging or Dixon water/fat imaging, a water/fat separation can be achieved by calculating contributions of water and fat from two or more corresponding echoes, acquired at different echo times. In general such a separation is possible because there is a known precessional frequency difference between hydrogens in fat and water. In its simplest form, water and fat can be seen as forming a 2-line spectrum (which does not exclude more sophisticated spectral models). Thus, water and fat images are generated by either addition or subtraction of the 'in phase' and 'out of phase' datasets, obtained at defined gradient echo times.

It is known that a number of artifacts can appear in MR images acquired from a region of the examined body in which flow phenomena occur, for example an arterial blood flow.

SUMMARY OF THE INVENTION

From the foregoing it is readily appreciated that there is a need for an improved MR imaging technique. It is consequently an object of the invention to provide a method that enables efficient compensation of flow artifacts in combination with Dixon water/fat separation. An insight of the invention is that fow affects the amplitude and phase of the acquired MR signals and thus also the water/fat separation. The two most striking effects of flow are a reduction or a gain of the MR signal intensity as a consequence of an incoherent addition of the phases of the individual species in a given image element (pixel/voxel), and the formation of a number of ghosting artifacts as a consequence of the pulsating blood flow during the cardiac cycle.

In accordance with the invention, a method of MR imaging of a body of a patient placed in the examination volume of a MR device is disclosed. The method comprises the steps of:

a) generating MR echo signals at two or more echo times by subjecting the portion of the body to a MR imaging sequence of RF pulses and switched magnetic field gradients, wherein the MR imaging sequence is a Dixon sequence;
b) acquiring the MR echo signals;
c) reconstructing one or more single-echo MR images from the MR echo signals;
d) segmenting the blood vessels from the MR images;
e) detecting and compensating for blood flow-induced variations of the amplitude or phase in the single-echo MR images within the blood vessel lumen; and
f) separating signal contributions from water and fat spins to the compensated single-echo MR images.

In accordance with the invention, MR echo signals are acquired at two or more different echo times using a conventional Dixon technique, and single-echo MR images are reconstructed from the acquired MR echo signals (with the term "single-echo MR image" meaning that the respective MR image is reconstructed from MR echo signals attributed to one of the two or more echo time values). That is two or more single-echo MR images are reconstructed, one for each of the two or more echo times. As a next step, blood vessel regions are determined in the reconstructed MR images by using an image segmentation technique. Within the meaning of the invention, image segmentation is understood as the process of partitioning the digital MR images into multiple segments (sets of pixels or voxels forming image regions). Image segmentation is used to locate blood vessels and their boundaries in the MR images. Different segmentation algorithms applicable in combination with the invention are known in the art, such as thresholding, clustering methods, histogrambased methods, edge detection techniques, region growing methods, etc. After locating the blood vessel regions in the reconstructed MR images, blood flow-induced variations of the amplitude or phase in the single-echo MR images within the blood vessel lumen are detected and compensated for. Finally, signal contributions from water and fat spins to the compensated single-echo MR images are separated as in common Dixon-type imaging. The mentioned flow-induced artifacts are significantly reduced in the resulting water and/or fat MR images by the method of the invention.

In other words, the invention proposes to extract—by means of image segmentation—blood vessels from the MR images to suppress artifacts arising from the application of Dixon methods in the presence of flow. For example, the blood flow-induced variations of the amplitude or phase in the single-echo MR images may be compensated for according to the invention by assuming no contribution from fat spins to the MR images within the blood vessel lumen, because fat does not represent a component of body fluids.

Furthermore, the method of the invention may comprise the steps of predicting positions of blood flow-induced ghosting artifacts outside the blood vessel regions and eliminating the ghosting artifacts. For example, ghosting artifacts may be detected by comparing the reconstructed single-echo MR images, wherein ghosting artifacts can be identified on the basis of local intensity losses and/or gains (flow replica) in one of the single-echo MR images as compared with another one of the single-echo MR images at the predicted ghosting positions. Once the ghosting artifacts are identified, it is straightforward to eliminate them, for example by restoring lost local intensity or by clipping local excess intensity in the reconstructed MR images.

In this way, the invention permits eliminating leakage artifacts (for example "leakage" of signal contributions from fat into the water MR images), swapping artifacts (fat signals occurring instead of water signals and vice versa), and ghosting artifacts.

The invention is based on insights regarding the origin and nature of flow-induced artifacts in Dixon imaging:

Phase offsets of the acquired MR echo signals in the blood vessel regions due to flow arise for example from constant flow in bipolar dual gradient echo MR imaging without flow compensation. These phase offsets grow with the velocity of the flow and depend on the flow direction and in particular on the readout magnetic field gradient employed. Such phase offsets may lead to apparent spatial discontinuities in $B_0$ and thus to swapping and/or, if smoothing is applied to the $B_0$ maps used, leakage artifacts.

Amplitude losses in the vessels may arise from non-constant flow or partial volume flow in MR imaging without or with only partial flow compensation, from any flow in the presence of a background magnetic field gradient ($B_0$ inhomogeneity), and from $T_2^*$ decay. Such amplitude losses grow with the echo time and may lead to leakage artifacts as well.

Amplitude gain in the vessels arises in particular from the rephasing effect of the even echoes in bipolar multi-gradient echo MR imaging. Such amplitude gain often occurs in combination with the above mentioned amplitude losses and may also cause leakage artifacts.

Ghosting outside the vessels due to pulsatile flow arises in particular in MR imaging without or with only partial flow compensation. Its severity grows with the original MR echo signal intensity in the respective blood vessel and depends on the heart rate, the repetition time of the MR imaging sequence, the order of acquisition of k-space profiles etc. Such ghosting may lead to both hyper- and hypo-intense signal at various positions outside the blood vessels, which are equidistantly spaced in the phase encoding direction, and may also affect the signal intensity in the blood vessels.

Further flow-induced artifacts (such as misregistration and in-flow artifacts) are essentially unaffected by Dixon methods, since the amplitudes and phases of the MR echo signals acquired at different echo times are consistently varied.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
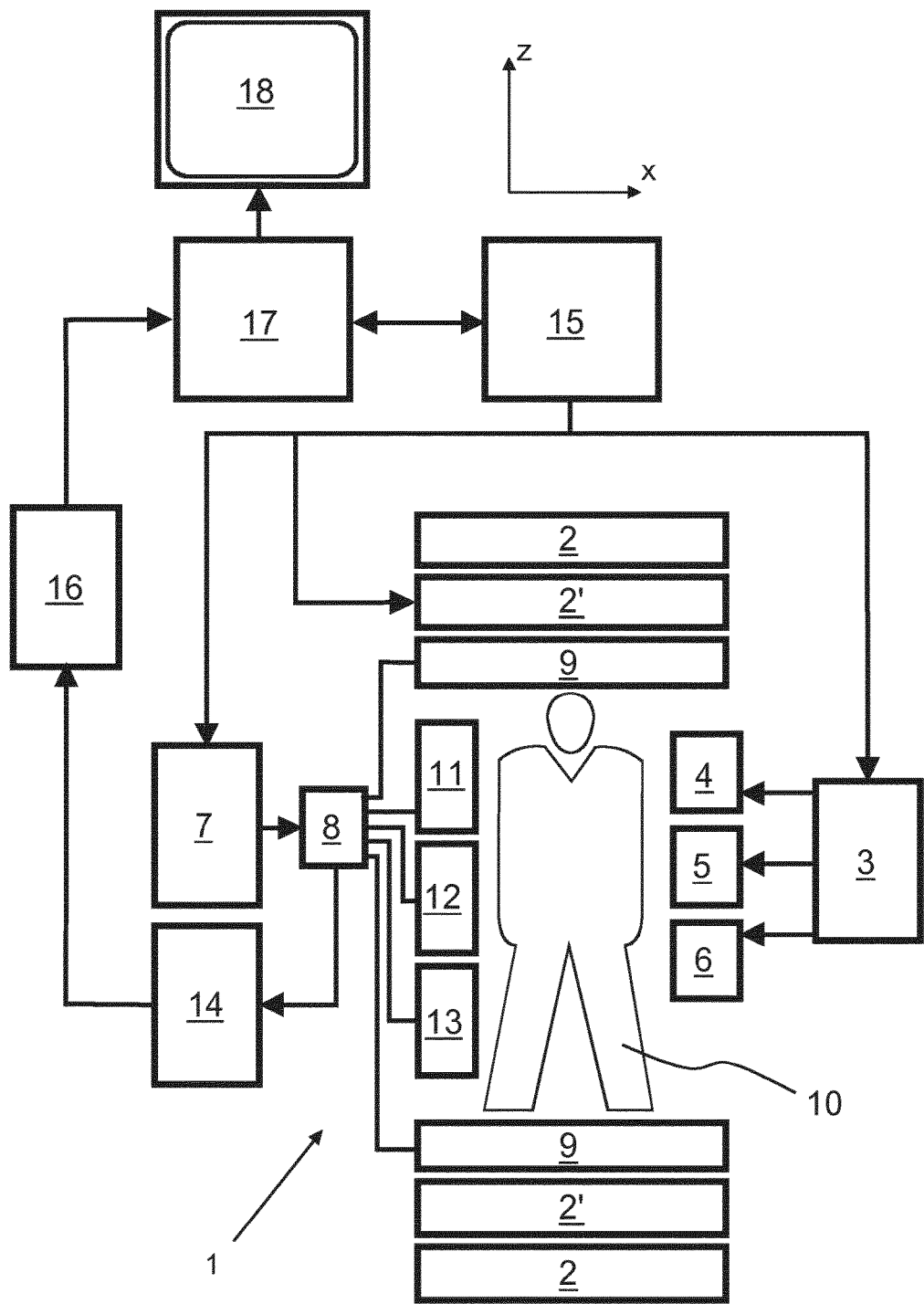
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
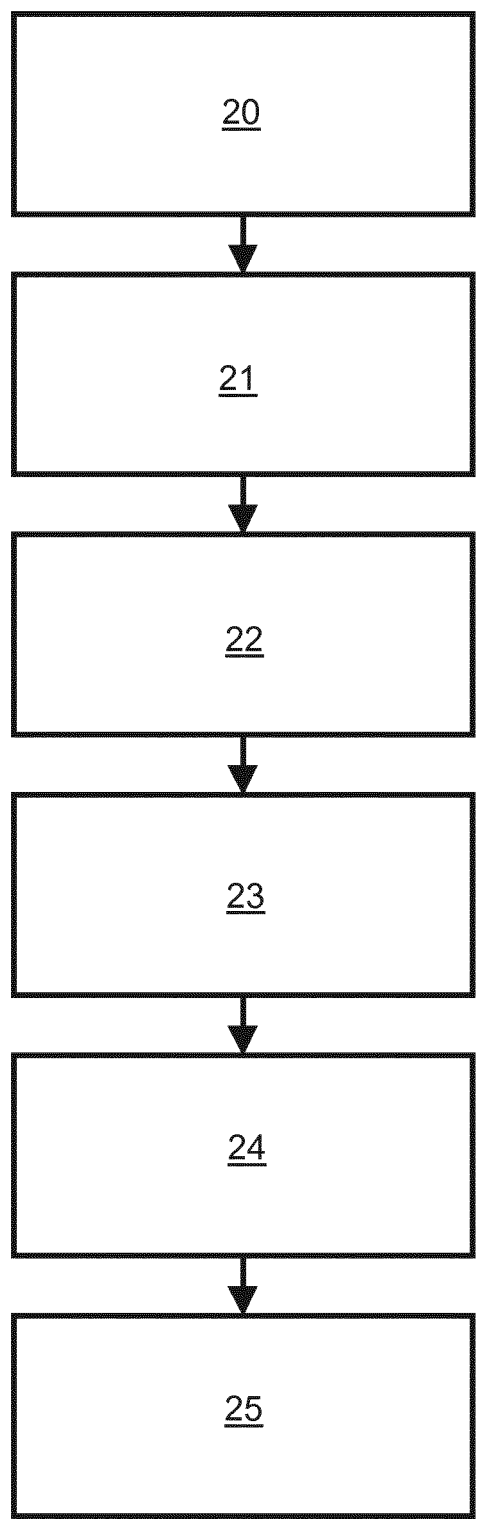
FIG. 2 shows a block diagram schematically illustrating the method of the invention.

FIG. 2 illustrates a preferred embodiment of the method of the invention, wherein all of the above-mentioned flow-induced artifacts in Dixon imaging, independent of specific parameters of the used MR imaging sequence, are eliminated. In step 20, a bipolar dual gradient echo MR imaging sequence is applied for Dixon imaging in a conventional fashion, wherein MR echo signals are acquired at a first and a second echo time. In step 21, individual single-echo MR images are reconstructed from the acquired MR echo signals. The single-echo MR images are used in step 22 to extract blood vessels by means of segmentation. Any known image processing method may be used for this purpose. The segmentation may rely on one or more of the reconstructed single-echo MR images. It may be based on the maximum signal intensity in one of the single-echo MR images, in order to be robust against the above-described flow-induced amplitude loss or amplitude gain artifacts, or it may be based on the even echo single-echo MR images only, in order to be robust against amplitude gain and ghosting artifacts. The segmentation may alternatively or additionally be based on water and fat MR images. These may be produced from the reconstructed single-echo MR images using a standard water/fat separation technique. For example, a single-echo Dixon water/fat separation may be applied to the even echo single-echo MR images to make the water/fat separation more robust against flow effects, potentially at the expense of general image quality. In step 23, a detection and compensation of blood flow-induced variations of the amplitude or phase in the single-echo MR images is performed within the blood vessel lumen. Within the vessels, both amplitude losses in the single-echo MR images due to intra-voxel dephasing and amplitude gains due to flow compensation are compensated for by assuming no contribution from fat spins to the respective MR image values. The water signal is essentially set equal to the amplitude in the first single-echo MR image (amplitude loss) and equal to the amplitude in the second single-echo MR image (amplitude gain). The fat contribution is essentially set equal to zero in both cases. The detection of amplitude gains due to the even echo rephasing effect may additionally consider the direction of the particular flow in a vessel relative to the direction of the readout magnetic field gradient. The amplitudes in the single-echo MR images are corrected accordingly as a basis for the subsequent steps. A prediction of ghosting outside the vessel regions is performed in step 24. On the basis of the measured patient's heart rate the ghosting artifacts' positions in the single echo MR images can be estimated. Ghosting is essentially to be expected at multiples of the distance 1/(heart rate×repetition time) in units of voxels in the first phase encoding direction (disregarding any interpolation), and at multiples of the distance 1/(heart rate×repetition time×number of phase encoding steps in the first phase encoding direction) in the second phase encoding direction (if existing) from the originating vessel. At and around multiples of this distance, voxels are marked. This step may be complemented by a detection and suppression of ghosting, wherein, for example, (unexpected) signal losses from the first, more out-of-phase echo time to the second, more in-phase echo time are exploited to detect hyper-intense ghosting due to pulsatile flow. Additionally, the then known intensity modulation of the ghosting along the phase encoding direction may be exploited to predict the intensity of the ghosting at remaining multiples of this distance. This step may again consider the direction of the particular vessel and thus the flow relative to the direction of the readout magnetic field gradient. The heart rate may be assumed as a fixed value, it may be estimated, or it may be measured during the acquisition of the MR echo signals. Finally, a modified water/fat separation is performed in step 25 in order to obtain separate water and fat MR images or to suppress fat in a water MR image. To accommodate potential phase offsets in the single-echo MR images in the vessel regions, no or only a weak spatial smoothness constraints are applied to the estimates of $B_0$ across the vessel boundaries. For the voxels marked in step 24, the estimates of $B_0$ are obtained by interpolation from a neighborhood, and a single-point water/fat separation is then performed based on the even echo single-echo MR images only. A similar procedure may be applied within the blood vessel regions to prevent potential phase offsets in the single-echo MR images leading to swapping artifacts. The phase offsets seen across the vessel boundaries after the water/fat separation may be exploited to estimate flow velocities. For this purpose, the acquired MR echo signals may be considered as resulting from phase contrast angiography. The orientation of the particular vessel with respect to the direction of the readout magnetic field gradient and the (known) moments of the readout magnetic field gradients for the individual echoes may be taken into account to more accurately estimate the flow velocities. The results may in turn be exploited for consistency checks, also in the vessel segmentation step, by assuming appropriate physiological limits. The same as for the phase offsets holds for the intensity modulation of the ghosting artifacts seen along the phase encoding direction.

The proposed procedure may also be applied to other types of flow, e.g. of cerebrospinal fluid.

Figure 3:
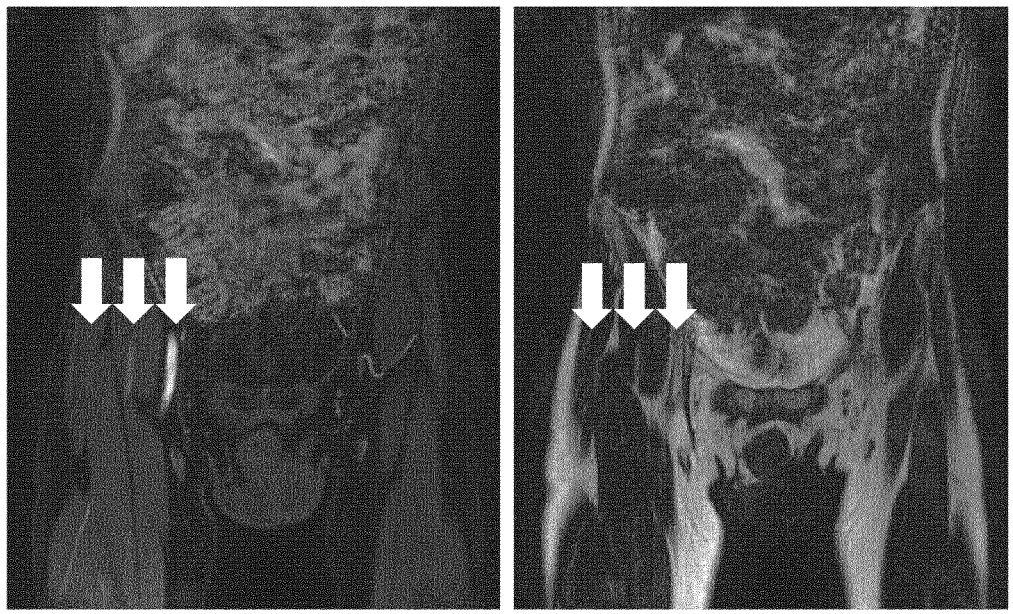
FIG. 3 shows water and fat MR images generated with conventional water/fat separation.

FIG. 3 shows water (left) and fat (right) MR images generated by a conventional water/fat separation technique. The MR echo signals are acquired using Dixon imaging at two different echo times, namely 1.8 ms and 3.0 ms at 1.5 Tesla from a selected slice from the aortoiliac station of a peripheral angiography examination. The arrows highlight the ghost artifacts outside (originating from pulsatile blood flow in the vessel) and the leaking artifacts inside the vessel.

Figure 4:
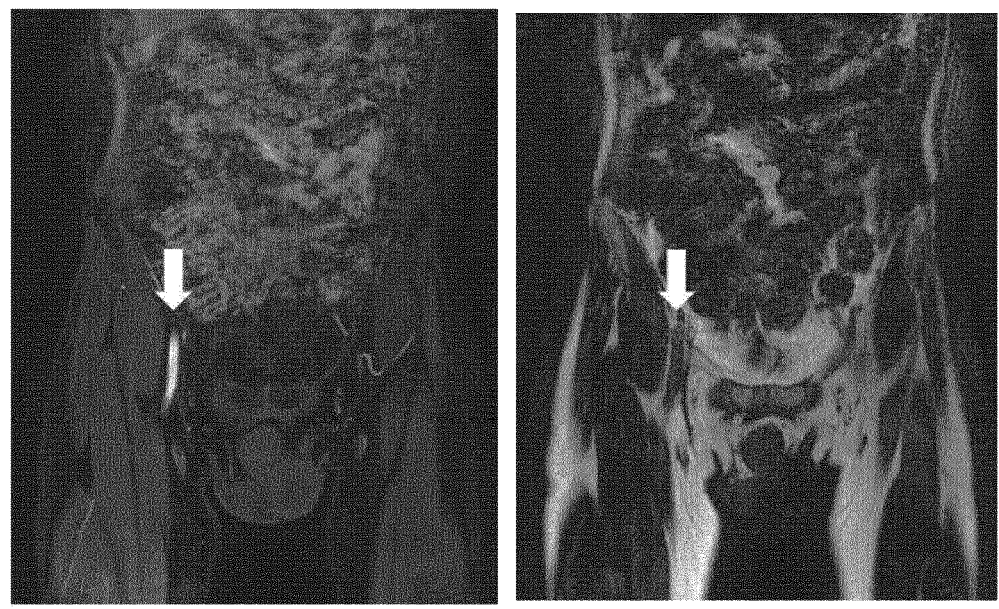
FIG. 4 shows water and fat MR images generated using the method of the invention.

FIG. 4 shows water (left) and fat (right) MR images generated by the method of the invention from the same MR signals as the MR images shown in FIG. 3, including the detection and compensation of blood flow-induced MR signal amplitude and phase variations in the single-echo MR images within the blood vessel lumen and the detection and suppression of ghost artifacts at defined distances from the blood vessels.

The invention claimed is:

1. A method of magnetic resonance (MR) imaging of a portion of a patient's body placed in an examination volume of a MR device, the method comprising:
   a) generating MR echo signals at two or more echo times by subjecting the portion of the body to a MR imaging sequence of RF pulses and switched magnetic field gradients, wherein the MR imaging sequence is a Dixon sequence;
   b) acquiring the MR echo signals;
   c) reconstructing two or more single-echo MR images, one for each of the two or more echo times from the MR echo signals;
   d) segmenting blood vessels from the MR images;
   e) detecting and compensating for blood flow-induced variations of the amplitude or phase in the single-echo MR images within the blood vessel lumen; and
   f) separating signal contributions from water and fat spins to the compensated single-echo MR images.

2. The method of claim 1, further comprising the steps of:
   determining or predicting positions of blood flow-induced ghosting artifacts outside the blood vessel lumen by comparing the reconstructed single-echo MR images, wherein ghosting artifacts are identified on the basis of local intensity losses and/or gains (flow replica) in one of the single-echo MR images as compared with another one of the single-echo MR images at the predicted ghosting positions; and
   eliminating the ghosting artifacts.

3. The method of claim 1, further comprising measuring the patient's heart rate and estimating ghosting artifacts' positions in the single echo MR images on the basis of the measured heart rate.

4. The method of claim 1, wherein the blood flow-induced variations of the amplitude or phase in the single-echo MR images within the blood vessels are compensated for by assuming no contribution from fat spins to the amplitude and phase in the single-echo MR images within the blood vessel regions.

5. The method of claim 1, further comprising estimating the blood flow velocity from phase offsets of the MR image values across boundaries of the blood vessels.

6. The method of claim 1, wherein the blood vessel direction relative to the direction of the readout magnetic field gradient of the MR imaging sequence is taken into account.

7. The method of claim 1, wherein the final separation of signal contributions from water and fat spins to the compensated single-echo MR images applies no or only a weak spatial smoothness constraint to the estimates of $B_0$ across the vessel boundaries.

8. A magnetic resonance (MR) device for carrying out the method of claim 1, which MR device includes at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals, wherein the MR device is configured to perform the following steps:
- a) generating MR echo signals at two or more echo times by subjecting the portion of the body to a MR imaging sequence of RF pulses and switched magnetic field gradients, wherein the MR imaging sequence is a Dixon sequence;
- b) acquiring the MR echo signals;
- c) reconstructing two or more single-echo MR images, one for each of the two ore more echo times from the MR echo signals;
- d) segmenting the blood vessels from the MR images;
- e) detecting and compensating for blood flow-induced variations of the amplitude or phase in the single-echo MR images within the blood vessel lumen, and
- f) separating signal contributions from water and fat spins to the compensated single-echo MR images.

9. A computer program to be run on a magnetic resonance (MR) device, which computer program comprises instructions for:
- a) generating a MR imaging sequence of RF pulses and switched magnetic field gradients, wherein the MR imaging sequence is a Dixon sequence;
- b) acquiring MR echo signals at two or more echo times;
- c) reconstructing one or more single-echo MR images from the MR echo signals;
- d) segmenting the blood vessels from the MR images;
- e) detecting and compensating for blood flow-induced variations of the amplitude or phase in the single-echo MR images within the blood vessel lumen, and
- f) separating signal contributions from water and fat spins to the compensated single-echo MR images.

10. A method of magnetic resonance (MR) imaging of a portion of a patient's body placed in the examination volume of a MR device, the method comprising the steps of:
- a) generating MR echo signals at two or more echo times by subjecting the portion of the body to a MR imaging sequence of RF pulses and switched magnetic field gradients, wherein the MR imaging sequence is a Dixon sequence;
- b) acquiring the MR echo signals;
- c) reconstructing two or more single-echo MR images, one for each of the two or more echo times from the MR echo signals;
- d) separating signal contributions from water and fat spins to the MR images to form an initial water MR image and an initial fat MR image
- e) segmenting blood vessels from the initial water and fat MR images; and
- f) detecting and compensating for blood flow-induced variations of the amplitude or phase in the initial water and fat MR images within the blood vessel lumen.

11. A magnetic resonance (MR) device for carrying out the method claimed in claim 10, which MR device includes at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals, wherein the MR device is configured to perform the following steps:
- a) generating MR echo signals at two or more echo times by subjecting the portion of the body to a MR imaging sequence of RF pulses and switched magnetic field gradients, wherein the MR imaging sequence is a Dixon sequence;
- b) acquiring the MR echo signals;
- c) reconstructing two or more single-echo MR images, one for each of the two or more echo times from the MR echo signals;
- d) separating signal contributions from water and fat spins to the MR images to form an initial water MR image and an initial fat MR image
- e) segmenting blood vessels from the initial water and fat MR images; and
- f) detecting and compensating for blood flow-induced variations of the amplitude or phase in the initial water and fat MR images within the blood vessel lumen.

12. A computer program to be run on a magnetic resonance (MR) device, which computer program comprises instructions for:
- a) generating MR echo signals at two or more echo times by subjecting the portion of the body to a MR imaging sequence of RF pulses and switched magnetic field gradients, wherein the MR imaging sequence is a Dixon sequence;
- b) acquiring the MR echo signals;
- c) reconstructing two or more single-echo MR images, one for each of the two ore more echo times from the MR echo signals;
- d) separating signal contributions from water and fat spins to the MR images to form an initial water MR image and an initial fat MR image
- e) segmenting blood vessels from the initial water and fat MR images; and
- f) detecting and compensating for blood flow-induced variations of the amplitude or phase in the initial water and fat MR images within the blood vessel lumen.

* * * * *